United States Patent
Mahadik et al.

(10) Patent No.: US 9,129,799 B2
(45) Date of Patent: Sep. 8, 2015

(54) ELIMINATION OF BASAL PLANE DISLOCATIONS IN POST GROWTH SILICON CARBIDE EPITAXIAL LAYERS BY HIGH TEMPERATURE ANNEALING WHILE PRESERVING SURFACE MORPHOLOGY

(71) Applicants: Nadeemullah A. Mahadik, Springfield, VA (US); Robert E. Stahlbush, Silver Spring, MD (US); Marko J. Tadjer, Springfield, VA (US); Eugene A. Imhoff, Washington, DC (US); Boris N. Feigelson, Springfield, VA (US)

(72) Inventors: Nadeemullah A. Mahadik, Springfield, VA (US); Robert E. Stahlbush, Silver Spring, MD (US); Marko J. Tadjer, Springfield, VA (US); Eugene A. Imhoff, Washington, DC (US); Boris N. Feigelson, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/498,065

(22) Filed: Sep. 26, 2014

(65) Prior Publication Data

US 2015/0155166 A1 Jun. 4, 2015

Related U.S. Application Data

(60) Provisional application No. 61/883,266, filed on Sep. 27, 2013.

(51) Int. Cl.
  H01L 21/02 (2006.01)
  H01L 21/04 (2006.01)
  H01L 29/16 (2006.01)

(52) U.S. Cl.
  CPC ...... *H01L 21/02378* (2013.01); *H01L 29/1608* (2013.01)

(58) Field of Classification Search
  CPC .................. H01L 21/02447; H01L 21/045
  See application file for complete search history.

(56) References Cited

U.S. PATENT DOCUMENTS

| | | | |
|---|---|---|---|
| 7,018,554 B2* | 3/2006 | Sumakeris | 216/67 |
| 8,518,808 B2* | 8/2013 | Feigelson et al. | 438/502 |
| 2002/0023581 A1* | 2/2002 | Vodakov et al. | 117/108 |
| 2005/0064723 A1* | 3/2005 | Sumakeris | 438/757 |
| 2007/0221614 A1* | 9/2007 | Sumakeris | 216/57 |
| 2008/0105949 A1* | 5/2008 | Zhang et al. | 257/584 |
| 2009/0072242 A1* | 3/2009 | Zhang | 257/77 |
| 2010/0140628 A1* | 6/2010 | Zhang | 257/77 |
| 2012/0068188 A1* | 3/2012 | Feigelson et al. | 257/76 |
| 2012/0142173 A1* | 6/2012 | Watanabe et al. | 438/504 |
| 2014/0264579 A1* | 9/2014 | Pala et al. | 257/339 |

\* cited by examiner

*Primary Examiner* — Lex Malsawma
(74) *Attorney, Agent, or Firm* — US Naval Research Laboratory; Rebecca L. Forman

(57) ABSTRACT

A method to remove basal plane dislocations in post growth silicon carbide epitaxial layers by capping post growth silicon carbide epilayers with a graphite cap and annealing the capped silicon carbon epilayers at a temperature of 1750° C. or greater with a nitrogen overpressure of 60-110 psi, wherein basal plane dislocations in the epilayers are removed while surface morphology is preserved. Also disclosed is the related silicon carbide substrate material made by this method.

12 Claims, 1 Drawing Sheet

ELIMINATION OF BASAL PLANE DISLOCATIONS IN POST GROWTH SILICON CARBIDE EPITAXIAL LAYERS BY HIGH TEMPERATURE ANNEALING WHILE PRESERVING SURFACE MORPHOLOGY

PRIORITY CLAIM

The present application is a non-provisional application claiming the benefit of U.S. Provisional Application No. 61/883,266, filed on Sep. 27, 2013 by Nadeemmullah A. Mahadik et al., entitled "Elimination of Basal Plane Dislocations in Post Growth Silicon Carbide Epitaxial Layers by High Temperature Annealing while Preserving Surface Morphology," the entire contents of which is incorporated herein by reference.

BACKGROUND OF THE INVENTION

1. Field of the Invention

The present invention relates to removing basal plane dislocations in silicon carbide (SiC) epitaxially grown layers.

2. Description of the Prior Art

Basal plane dislocations (BPD) in SiC epilayers cause formation of stacking faults (SF) during device operation, which leads to forward voltage degradation in minority carrier devices. Typical growth of SiC epilayers using conventional chemical vapor deposition techniques still results in BPD density of 100 $cm^{-2}$ or more. These adversely affect the device yield and reliability. There are no known reports that successfully attempt to mitigate the BPDs in the SiC epilayers after the epi-growth. High temperature annealing in SiC epilayers has been performed by various methods for incorporation of implanted species and to reduce the lattice damage caused by the implantation process. These previous anneals were typically performed up to 1700° C., using a graphite cap to reduce surface degradation.

BRIEF SUMMARY OF THE INVENTION

The aforementioned problems are overcome in the present invention which provides a method to remove basal plane dislocations in post growth silicon carbide epitaxial layers by capping post growth silicon carbide epilayers with a graphite cap and annealing the capped silicon carbon epilayers at a temperature of 1750° C. or greater with a nitrogen overpressure of 60-110 psi, wherein basal plane dislocations in the epilayers are removed while surface morphology is preserved. Also disclosed is the related silicon carbide substrate material made by this method.

The purpose of this invention is to provide a means to remove basal plane dislocations already present in silicon carbide (SiC) epitaxially grown layers, while preserving the surface morphology. This method uses a high temperature annealing process under high ambient pressure and utilizes a surface protective coating on epitaxially grown SiC layers to remove the basal plane dislocations present in it. There are no reported methods for the removal of BPDs after the growth of SiC epilayers, while preserving the surface morphology.

The subject of the invention is single crystal silicon carbide (SiC) substrate material and epilayers grown by any typical methods. The invention provides means to remove defects, while preserving the sample surface in SiC semiconductors. More specifically the invented method uses a high temperature annealing process is used under high ambient pressure and utilizing a surface protective coating to eliminate basal plane dislocations (BPD) in SiC samples. This invention can be used to remove BPDs from SiC epitaxial layers after their growth, while preserving the surface morphology, which is important to realize high power density and high voltage SiC devices.

This invention can be used to anneal p-type implants in SiC to form higher conductivity p-type semiconductor regions, while preserving the surface.

This invention can be used to perform high temperature treatments to SiC to improve carrier lifetime in both p-type and n-type SiC layers.

Some advantages of the prevent invention include: BPDs are eliminated in SiC material while maintaining good surface morphology; compared to current methods, higher temperature annealing (in excess of 1750° C.) of SiC material can be used with no silicon sublimation from the surface, which prevents surface degradation; and higher temperature annealing (in excess of 1750° C.) can be used to improve the activation/incorporation of implanted species in the SiC lattice.

These and other features and advantages of the invention, as well as the invention itself, will become better understood by reference to the following detailed description, appended claims, and accompanying drawings.

DETAILED DESCRIPTION OF THE INVENTION

The purpose of the present invention is to remove the existing BPDs in the SiC epilayers while preserving the surface morphology. This requires high temperature annealing in excess of 1750° C. and has been accomplished by annealing the SiC samples under high nitrogen overpressure of 60-110 psi. The samples are capped with a specially formulated graphite cap to further prevent the sublimation of Si from the surface and thus preserve the surface morphology.

For experimentation, commercially available, 4 degree offcut, 15 µm, n-type 6E15 4H-SiC epilayers were used. The as-grown samples were imaged using ultraviolet photoluminescence (UVPL) imaging, which shows the BPDs in the epitaxial layers prior to annealing. Carriers were excited with the 334 nm line from an Ar-ion laser, and images were collected in the emission range of 600-1000 nm. The high resolution images of the entire sample was stitched together and analyzed The samples were then graphite capped using the following process. The samples were cleaned with a pirana solution consisting of $H_2SO_4$:$H_2O_2$:$H_2O$ in the ratio 1:1:5, followed by a solvent clean SC1 process. Then AZ 4620 photoresist was applied using a revolution speed of 5000 rpm for 1 minute. The samples were then heated to a temperature of 1100° C. in nitrogen ambient for 30 minutes to form a graphite cap. This was followed by the high temperature high pressure annealing process.

The high pressure annealing was carried out in a custom designed chamber, where the sample was inductively heated using radio frequency (RF) power to temperatures 1750-1840° C. for around 5 minutes. The chamber was maintained at a nitrogen over pressure of 60-110 psi. The post-annealed samples were then imaged to observe the removal of BPDs in the epilayers.

Figure 1A:
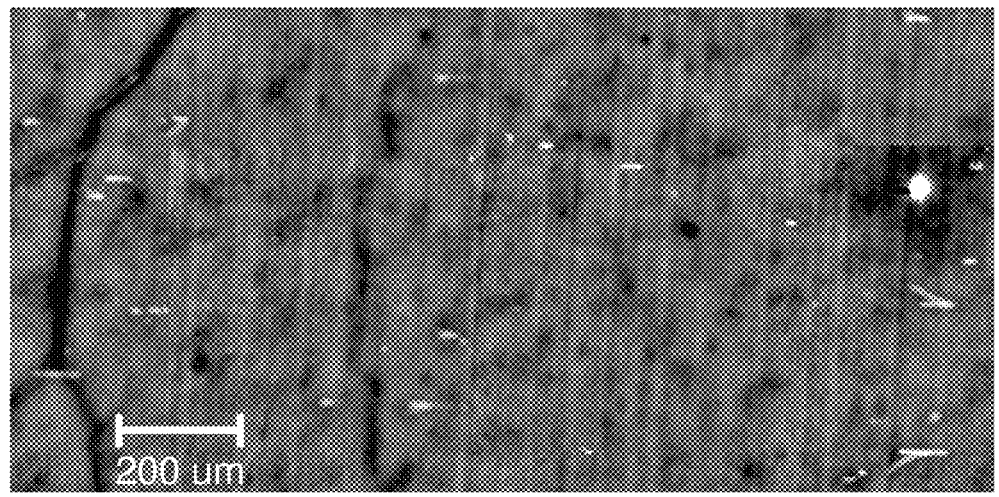
FIG. 1A shows an ultraviolet photoluminescence (UVPL) image of a pre-annealed sample.
Figure 1B:
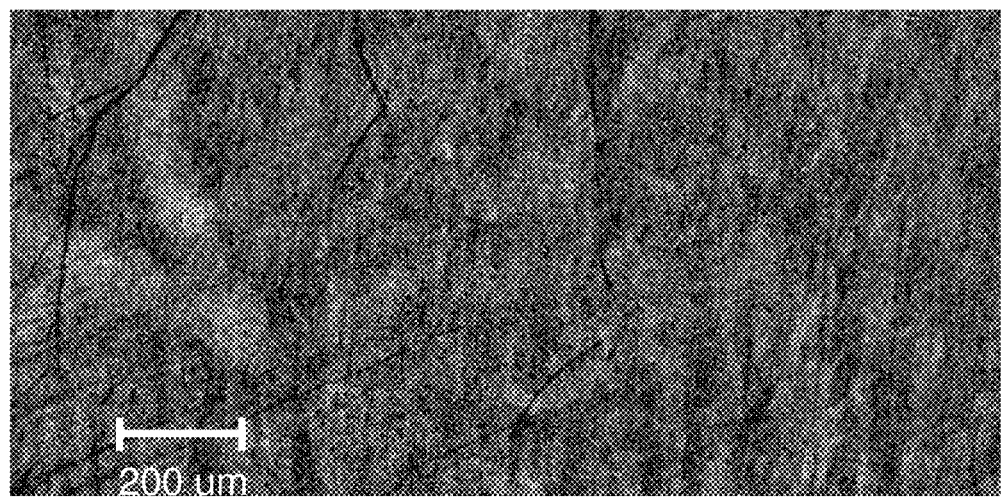
FIG. 1B shows a UVPL image showing the same exact region of the post-annealed sample that was treated at 1782° C. for 5 minutes under 100 psi nitrogen over pressure.

The imaging of the BPDs post-annealing was again performed using the UVPL system as described above. The images were then compared to their pre-annealed state. FIG. 1A shows the UVPL image of the pre-annealed sample. The white (bright) lines observed are the BPDs that are present in the epilayers after growth. This image is compared with the image shown in FIG. 1B, which shows the same exact region of the post-annealed sample that was performed at 1782° C. for 5 minutes under 110 psi nitrogen over pressure. It can be clearly seen that the BPDs (white lines) in the post annealed samples completely disappear. In addition the surface morphology of the sample is preserved as no scratches or surface imperfections are evident in the UVPL image. This was also further verified using optical microscopy.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method to remove basal plane dislocations in post growth silicon carbide epitaxial layers, comprising:
    capping post growth silicon carbide epilayers with a graphite cap; and
    annealing the capped silicon carbon epilayers at a temperature of 1750° C. or greater with a nitrogen overpressure of 60-110 psi, wherein basal plane dislocations in the epilayers are removed while surface morphology is preserved.

2. The method of claim 1, wherein the annealing is for five minutes.

3. The method of claim 1, wherein the annealing is done by inductive heating using radio frequency power.

4. The method of claim 1, wherein the silicon carbon epilayers are capped by a method comprising:
    cleaning the epilayers with a solution comprising $H_2SO_4$, $H_2O$ and $H_2O$ followed by a solvent clean SC1 process;
    applying a photoresist; and
    heating to a temperature of 1100° C. in nitrogen ambient.

5. The method of claim 4, wherein the ratio of $H_2SO_4$:$H_2O_2$:$H_2O$ is 1:1:5.

6. The method of claim 4, wherein the heating is for 30 minutes.

7. A silicon carbide substrate material made by the method comprising:
    capping post growth silicon carbide epilayers with a graphite cap; and
    annealing the capped silicon carbon epilayers at a temperature of 1750° C. or greater with a nitrogen overpressure of 60-110 psi, wherein basal plane dislocations in the epilayers are removed while surface morphology of the substrate material is preserved.

8. The silicon carbide substrate material of claim 7, wherein the annealing is for five minutes.

9. The silicon carbide substrate material of claim 7, wherein the annealing is done by inductive heating using radio frequency power.

10. The silicon carbide substrate material of claim 7, wherein the silicon carbon epilayers are capped by a method comprising:
    cleaning the epilayers with a solution comprising $H_2SO_4$, $H_2O_2$, and $H_2O$ followed by a solvent clean SC1 process;
    applying a photoresist; and
    heating to a temperature of 1100° C. in nitrogen ambient.

11. The silicon carbide substrate material of claim 10, wherein the ratio of $H_2SO_4$:$H_2O_2$:$H_2O$ is 1:1:5.

12. The silicon carbide substrate material of claim 10, wherein the heating is for 30 minutes.

* * * * *